United States Patent
Wang

(10) Patent No.: US 9,171,863 B2
(45) Date of Patent: Oct. 27, 2015

(54) METHODS AND APPARATUSES INCLUDING STRINGS OF MEMORY CELLS FORMED ALONG LEVELS OF SEMICONDUCTOR MATERIAL

(71) Applicant: Micron Technology, Inc., Boise, ID (US)

(72) Inventor: Hongmei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/543,063

(22) Filed: Nov. 17, 2014

(65) Prior Publication Data

US 2015/0072512 A1 Mar. 12, 2015

Related U.S. Application Data

(62) Division of application No. 13/222,602, filed on Aug. 31, 2011, now Pat. No. 8,912,589.

(51) Int. Cl.
| | |
|---|---|
| *H01L 21/3205* | (2006.01) |
| *H01L 21/4763* | (2006.01) |
| *H01L 27/115* | (2006.01) |
| *H01L 29/788* | (2006.01) |
| *H01L 29/792* | (2006.01) |
| *H01L 29/16* | (2006.01) |

(52) U.S. Cl.
CPC ...... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 29/16* (2013.01); *H01L 29/7889* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 6,998,314 B2 | 2/2006 | Prall | |
| 7,679,133 B2 | 3/2010 | Son et al. | |
| 7,838,864 B2 | 11/2010 | Parkinson | |
| 8,188,517 B2 | 5/2012 | Choi | |
| 2008/0242025 A1 | 10/2008 | Kim et al. | |
| 2009/0251963 A1 | 10/2009 | Seol et al. | |
| 2010/0163968 A1* | 7/2010 | Kim et al. | 257/324 |
| 2010/0226195 A1 | 9/2010 | Lue | |
| 2011/0051512 A1 | 3/2011 | Violette | |
| 2011/0284946 A1 | 11/2011 | Kiyotoshi | |
| 2013/0049096 A1 | 2/2013 | Wang | |

* cited by examiner

*Primary Examiner* — Sonya D McCall Shepard
(74) *Attorney, Agent, or Firm* — Schwegman Lundberg & Woessner, P.A.

(57) ABSTRACT

Various embodiments include methods and apparatuses including strings of memory cells formed along levels of semiconductor material. One such apparatus includes a stack comprised of a number of levels of single crystal silicon and a number of levels of dielectric material. Each of the levels of silicon is separated from an adjacent level of silicon by a level of the dielectric material. Strings of memory cells are formed along the levels of silicon. Additional apparatuses and methods are disclosed.

23 Claims, 17 Drawing Sheets

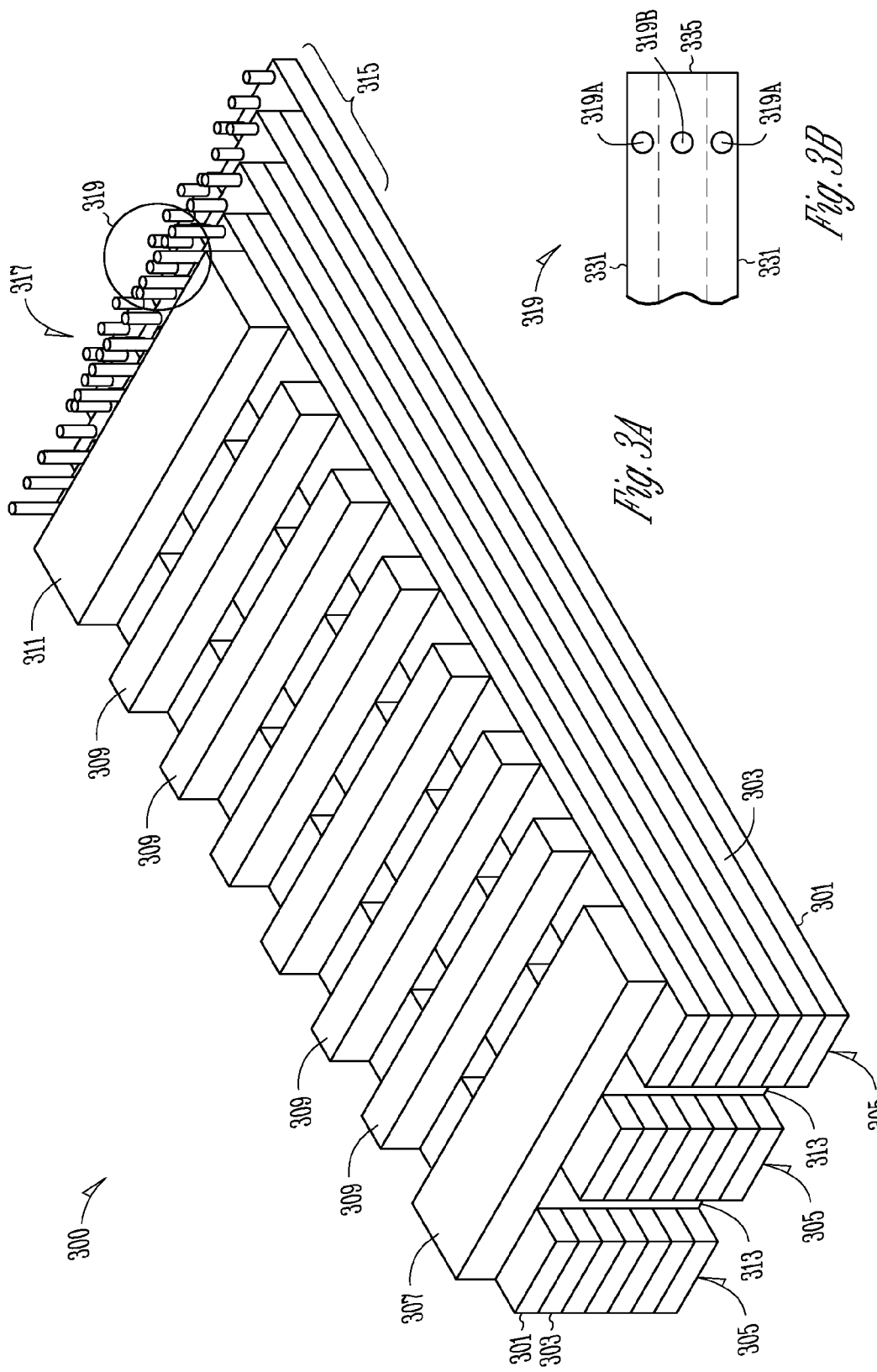

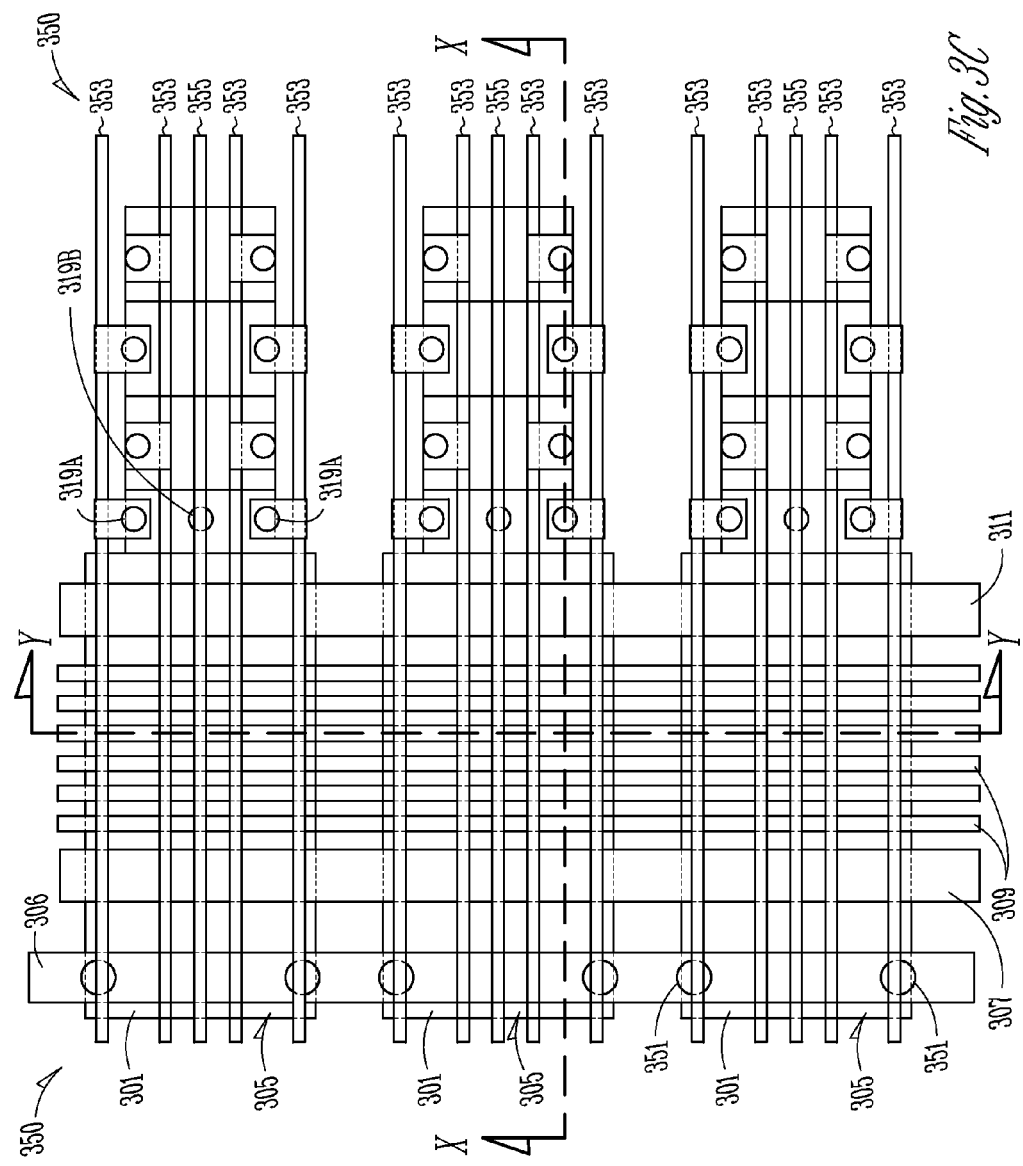

SECTION X-X

SECTION Y-Y

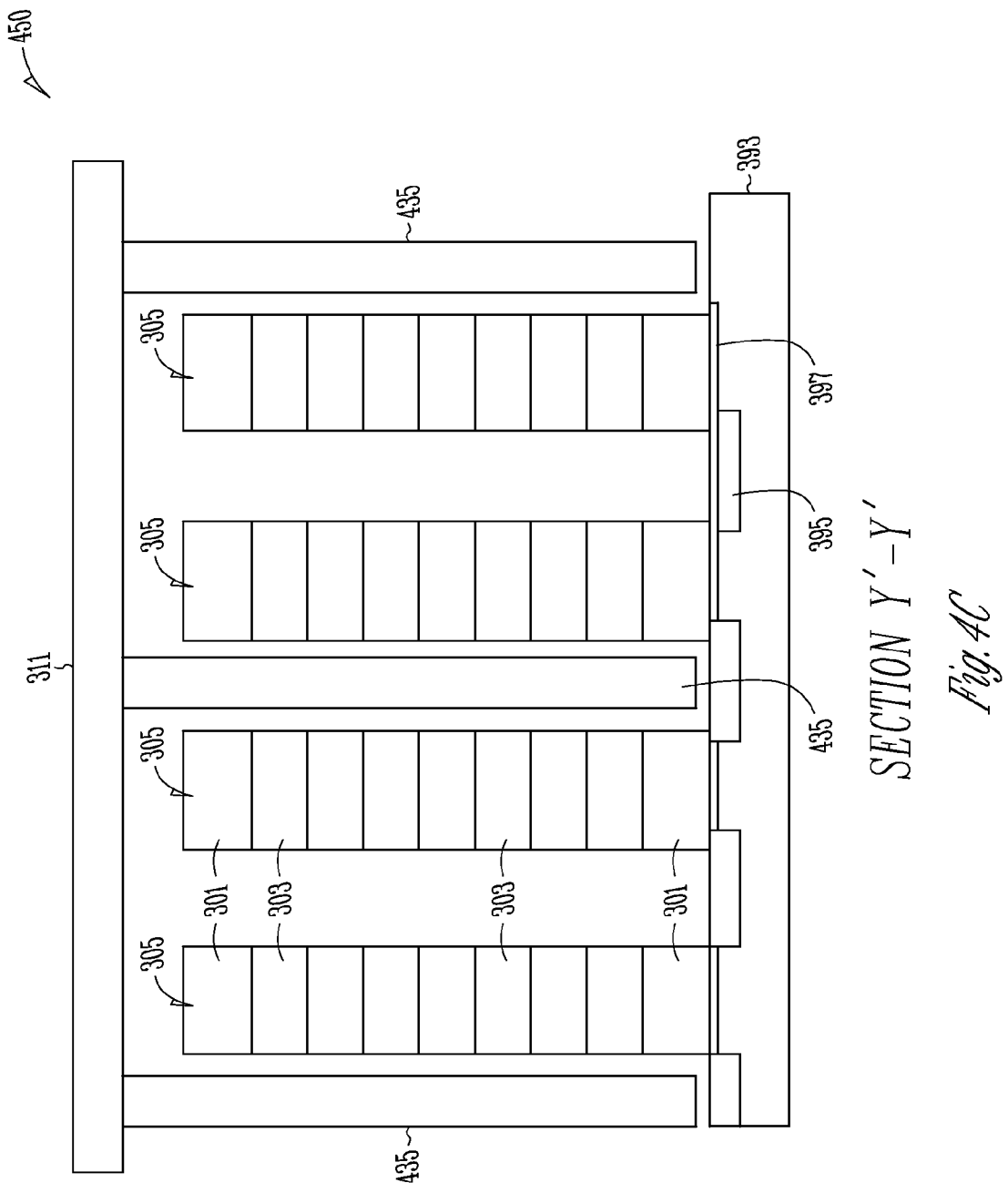

METHODS AND APPARATUSES INCLUDING STRINGS OF MEMORY CELLS FORMED ALONG LEVELS OF SEMICONDUCTOR MATERIAL

PRIORITY APPLICATION

This application is a divisional of U.S. application Ser. No. 13/222,602, filed Aug. 31, 2011, which is incorporated herein by reference in its entirety.

BACKGROUND

Computers and other electronic products, for example, digital televisions, digital cameras, and cellular phones, often use one or more memory devices to store information. Memory devices include memory cells. As the demand for increased storage capacity in memory devices increases, there is a need to increase the density of the memory cells to retain a correspondingly small device size.

BRIEF DESCRIPTION OF THE DRAWINGS

FIGS. 3A through 3E show a single select gate drain architecture according to an embodiment;

FIGS. 4A through 4C show a dual select gate drain architecture according to an embodiment;

DETAILED DESCRIPTION

Figure 1:
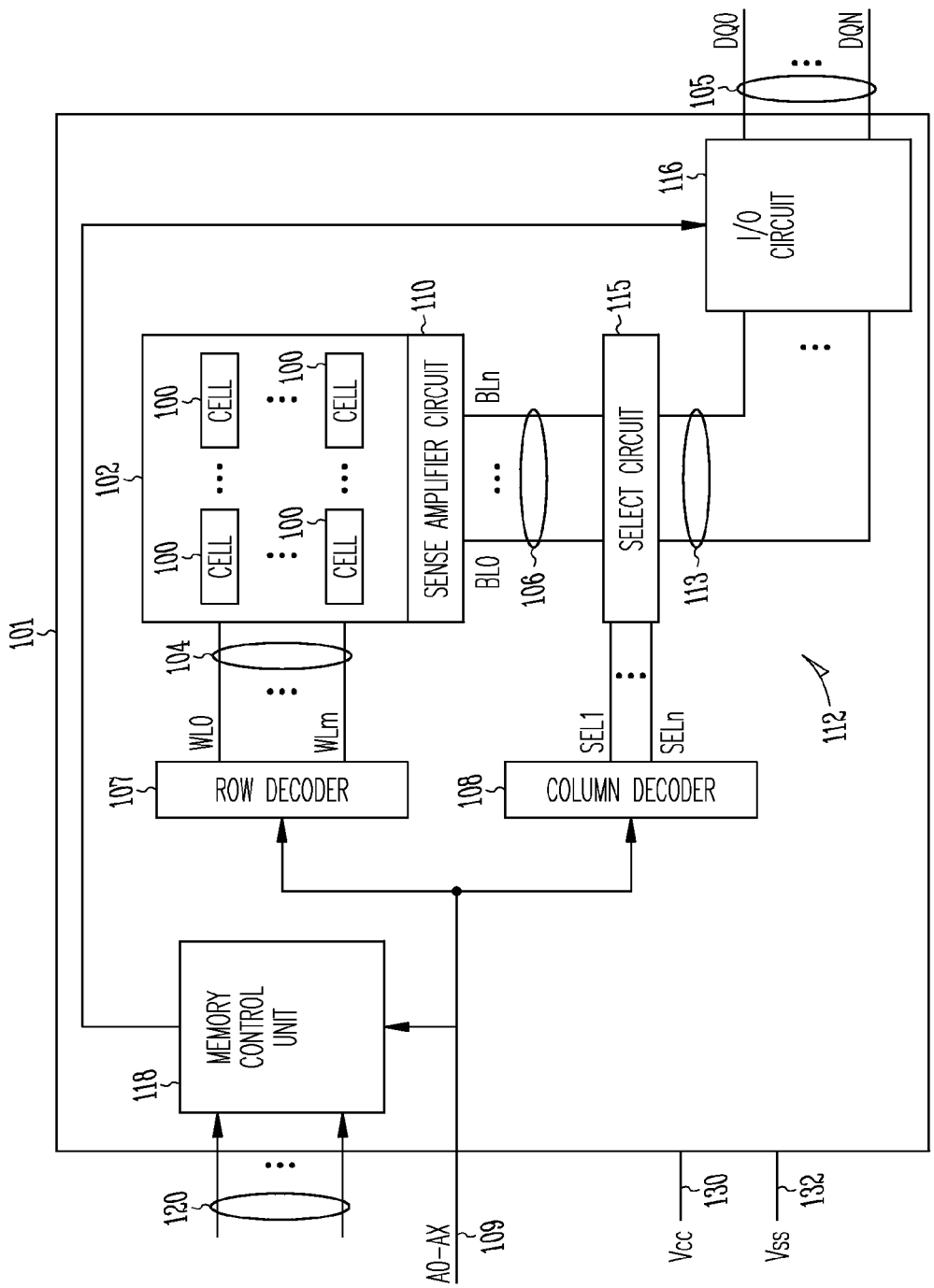
FIG. 1 shows a block diagram of a memory device having a memory array with memory cells, according to an embodiment.

The description that follows includes illustrative apparatuses (e.g., circuitry, devices, structures, and systems) and methods (e.g., fabrication processes, techniques, and technologies) that embody the inventive subject matter. In the following description, for purposes of explanation, numerous specific details are set forth in order to provide an understanding of various embodiments of the inventive subject matter. It will be evident, however, to those skilled in the art that various embodiments of the inventive subject matter may be practiced without these specific details. Further, well-known instruction instances, protocols, structures, fabrication technologies, and techniques have not been shown in detail, so as not to obscure the various illustrated embodiments.

As used herein, the term "or" may be construed in an inclusive or exclusive sense. Additionally, although various exemplary embodiments discussed below focus on a three-dimensional (3D) NAND memory device, the embodiments are merely given for clarity in disclosure, and thus, are not limited to NAND memory devices or even to memory devices in general. As an introduction to the subject, a few embodiments will be described briefly and generally in the following paragraphs, and then a more detailed description, with reference to the figures, will ensue.

One disclosed method of fabrication, and resulting apparatus, has an architecture comprising a stacked three-dimensional structure. The structure may be used to form, for example, strings of memory cells. In various embodiments, single crystal silicon strings of memory cells are provided. In such an embodiment, rather than building vertical polysilicon strings on top of a substrate, the disclosed structure builds stacked horizontal silicon strings into the substrate. Separate string channels can run along both sidewalls in a given level of single crystal silicon in the stacked structure. The sidewalls are described in more detail, by way of example, with reference to FIG. 4B, below. The disclosed structure can utilize all functions developed for, for example, planar NAND logic. At the same time, the disclosed structure can increase the memory density by stacking more memory strings in a given area.

In various embodiments, an apparatus is provided that includes a stack comprising a number of levels of semiconductor material and a number of levels of dielectric material. Each of the levels of semiconductor material is separated from a respective adjacent one of the levels of semiconductor material by at least a respective one of the levels of dielectric material. A respective string of memory cells are formed along each of the levels of semiconductor material.

In some embodiments of the apparatus, each of the levels of semiconductor material comprises opposing ones of a first sidewall and a second sidewall. A respective one of the strings of memory cells is formed along a respective one of the levels of semiconductor material that includes a first string of memory cells formed along the first sidewall of the respective level of semiconductor material and a second string of memory cells formed along the second sidewall of the respective level of semiconductor material.

In various embodiments, a method is provided that includes forming a first opening in a semiconductor substrate and forming an alternating arrangement of first and second blocks within the first opening. The first block comprises a different material than the second block. A second opening is formed within the alternating arrangement to form an alternating arrangement of first and second sidewall blocks from the first and second blocks, respectively. At least a portion of the second sidewall blocks to expose portions of the substrate and lateral openings are formed in the substrate at the exposed portions.

In some embodiments of the method, prior to forming the alternating arrangement of first and second blocks within the first opening, a dielectric liner is formed on at least sidewalls of the first opening. Additionally, removing at least the second sidewall blocks to expose portions of the substrate further includes removing portions of the dielectric liner underlying the second sidewall blocks, forming a control gate in the second opening, and forming a number of charge storage structures disposed between the control gate and remaining portions of the substrate.

In various embodiments, an apparatus is provided that includes a base substrate having a number of openings formed therein and a stack formed between each of the number of openings. Each stack has a number of levels of semiconductor material and a number of levels of dielectric material. Each level of the number of levels of semiconductor material is separated from an adjacent level of semiconductor material by at least one of the number of levels of dielectric material. Also, each of the levels of semiconductor material has a first side and an opposing second side. At least one string of memory cells is formed along at least one of the first side and the second side of the levels of semiconductor material.

In some embodiments of the apparatus, a number of control gates are disposed within the number of openings in the base substrate. A charge storage structure is disposed between a portion of each of the number of control gates and at least one of the number of levels of semiconductor material.

In various embodiments, an apparatus is provided that includes a base substrate having a number of openings formed therein and a multiple level structure formed between each of the number of openings. Each multiple level structure has a number of levels of silicon material and a number of levels of silicon dioxide material. Each level of the number of levels of silicon material is separated from an adjacent level of silicon material by at least one of the number of levels of silicon dioxide material. Each of the levels of silicon material has a first side and an opposing second side. At least one string of memory cells is formed on each of the first side and the second side of the levels of silicon material. A number of control gates are disposed within the number of openings in the base substrate. A charge storage structure is disposed between a portion of each of the number of control gates and at least one of the number of levels of silicon material.

Referring now to FIG. 1, a block diagram of an apparatus in the form of a memory device 101 is shown. The memory device 101 is shown to include a memory array 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

A sense amplifier circuit 110 operates to determine a value of information read from the memory cells 100 and the information in the form of signals to the first data lines 106. The sense amplifier circuit 110 can also use the signals on the first data lines 106 to determine values of information to be written to the memory cells 100.

The memory device 101 is further shown to include circuitry 112 to transfer information between the memory array 102 and input/output (I/O) lines 105. Signals DQ0 through DQN on the I/O lines 105 can represent information read from or to be written into the memory cells 100. The I/O lines 105 can include nodes within the memory device 101 (or alternatively, pins, solder balls, or other interconnect technologies such as controlled collapse chip connection (C4), or flip chip attach (FCA)) on a package where the memory device 101 can reside. Other devices external to the memory device 101 (e.g., a memory controller or a processor, not shown in FIG. 1) can communicate with the memory device 101 through the I/O lines 105, the address lines 109, or control lines 120.

The memory device 101 can perform memory operations, such as a read operation, to read information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100. A memory control unit 118 controls memory operations based on signals on the control lines 120. Examples of the signals on the control lines 120 can include one or more clock signals and other signals to indicate which operation (e.g., a programming or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming or read command) that can cause the memory device 101 to perform a corresponding memory operation (e.g., a program, read, or erase operation).

Each of the memory cells 100 can be programmed to a different one of at least two data states to represent, for example, a value of a single bit or a value of multiple bits such as two, three, four, or a higher number of bits. For example, each of the memory cells 100 can be programmed to one of two data states to represent a binary value of "0" or "1" of a single bit. Such a cell is sometimes called a single level cell. In another example, each of the memory cells 100 can be programmed to one of more than two data states to represent a value of, for example, multiple bits, such as one of four possible values "00," "01," "10," and "11" of two bits, one of eight possible values "000," "001," "010," "011," "100," "101," "110," and "111" of three bits, or one of another set of values of multiple bits. A cell that can be programmed to more than two data states is sometimes referred to as a multi-level cell (or multi-state cell). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{ss}$ can also operate at other voltages. Supply voltage signal $V_{cc}$ can include an external voltage supplied to the memory device 101 from an external power source such as a battery or an alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the information read from or to be programmed into the memory cells 100. The column decoder 108 can selectively activate the SEL1 through SELn signals based on the A0 through AX address signals on the address lines 109. The select circuit 115 can select the signals on the first data lines 106 and the second data lines 113 to provide communication between the memory array 102 and the I/O circuit 116 during read and programming operations.

The memory device 101 can include a non-volatile memory device and the memory cells 100 can include non-volatile memory cells such that the memory cells 100 can retain information stored therein when power (e.g., $V_{cc}$, $V_{ss}$, or both) is disconnected from the memory device 101.

Each of the memory cells 100 can include a memory element having material, at least a portion of which can be programmed to a desired data state (e.g., by storing a corresponding amount of charge on a charge storage structure, such as a floating gate or charge trap, coupled with various threshold voltage, $V_t$, changes after program or erase operations). Different data states can thus represent different values of information programmed in each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not necessarily shown in the figure, so as not to obscure the various embodiments described. The memory device 101 may include devices and memory cells, and operate using memory operations (e.g., programming and erase operations) similar to or identical to those described below with reference to various other figures and embodiments discussed herein.

Figure 2:
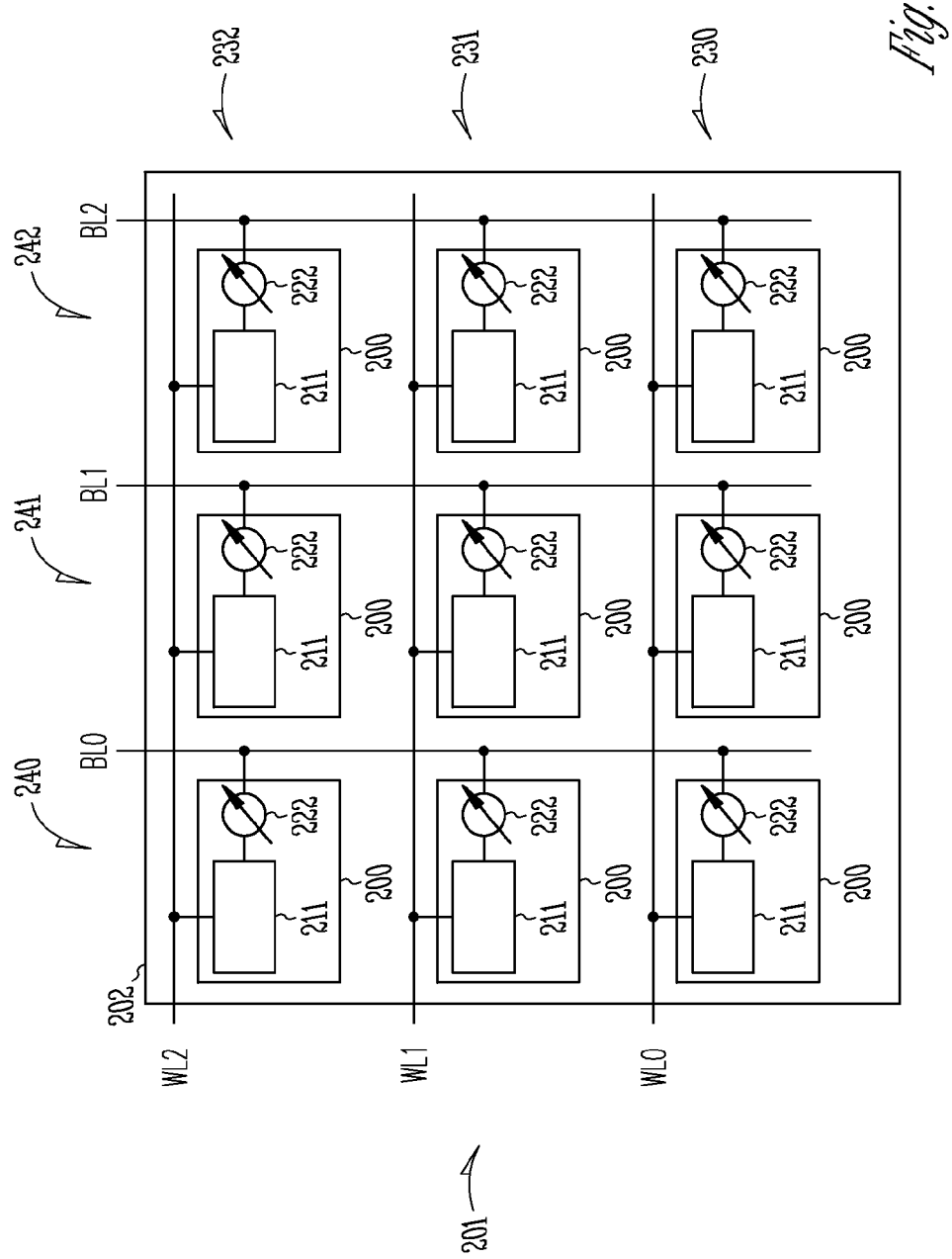
FIG. 2 shows a partial block diagram of a memory device having a memory array including memory cells with access components and memory elements, according to an embodiment.

With reference now to FIG. 2, a partial block diagram of an apparatus in the form of a memory device 201 is shown to include a memory array 202, including memory cells 200 with access components 211 and memory elements 222, according to an example embodiment. The memory array 202 may be similar or identical to the memory array 102 of FIG. 1. As further shown in FIG. 2, the memory cells 200 are shown to be arranged in a number of rows 230, 231, 232, along with access lines, for example word lines, to conduct signals such as signals WL0, WL1, and WL2. The memory cells are also shown to be arranged in a number of columns 240, 241, 242 along with data lines, for example bit lines, to conduct signals such as signals BL0, BL1, and BL2. The access components 211 can turn on (e.g., by using appropriate values of signals WL0, WL1, and WL2) to allow access to the memory elements 222, such as to operate the memory elements as pass elements, or to read information from or program (e.g., write) information into the memory elements 222.

Depending on the memory type, programming information into the memory elements 222 can include causing the memory elements 222 to have specific resistance values or to store specific amounts of charge. Thus, reading information from a memory cell 200 can include, for example, determining a resistance value of the memory element 222 or determining whether the memory cell 200 is placed in a conductive state in response to a specific voltage being applied to its access component 211. In either case, such a determining act may involve sensing a current (or absence of current) flowing through the memory cell 200 (e.g., by sensing a current of a bit line electrically coupled to the memory cell). Based on a measured value of the current, a corresponding value of the information stored in the memory can be determined. Determining values of the information based on the value of the current is discussed in more detail, below. The value of information stored in a memory cell 200 can be determined in still other ways, such as by sensing a voltage of a bit line electrically coupled to the memory cell.

FIGS. 3A through 3E show an apparatus in the form of a memory device having a single select gate drain architecture according to an embodiment. With specific reference to FIG. 3A, a schematic three-dimensional representation of a portion of an apparatus 300 is shown to include three stacks 305, each comprised of a number of levels of semiconductor material (e.g., silicon) 301 and a number of levels of dielectric material (e.g., silicon dioxide) 303. In each stack 305, each of the levels of the semiconductor material 301 is separated from a respective adjacent one of the levels of the semiconductor material 301 by at least a respective one of the levels of the dielectric material 303. Each of the stacks 305 could be considered to be a multiple level structure. A person of ordinary skill in the art, upon reading the disclosure provided herein, will recognize that materials other than silicon and silicon dioxide may be used. For example, various types of semiconductor materials, such as various elemental and compound semiconductors may be used as an alternative for or in conjunction with the silicon. Additionally, various types of dielectric materials, such as tantalum pentoxide ($Ta_2O_5$), silicon nitride ($Si_xN_y$), aluminum oxide ($Al_2O_3$), hafnium oxide ($HfO_2$), or a variety of other dielectric materials can be used as an alternative to or in conjunction with the silicon dioxide.

The apparatus 300 is also shown to include a select gate source line 307, a select gate drain line 311, and a number of access lines 309, for example word lines, to conduct signals. Although FIG. 3A shows six of the access lines 309, any number of lines may be used. As shown, each of the access lines 309, the select gate source line 307, and the select gate drain line 311 (albeit partially obscured) are electrically coupled to (e.g., in direct contact with) corresponding control gates 313. The control gates 313 are located in trenches, where each of the illustrated trenches is formed between and separates adjacent ones of the stacks 305. One example of such a trench is described in more detail with reference to FIG. 5A, below. Thus, each of the illustrated ones of the control gates 313 is shared between respective neighboring ones of the stacks 305, creating "common" control gates between adjacent ones of the stacks 305. Further, as described in more detail below by way of example, strings of memory cells can be fabricated along the sidewalls of each of the stacks 305.

As further shown in the apparatus 300, each level of the semiconductor material 301 in a given stack 305 is electrically coupled at one end to a number of contacts 317, described in more detail, below. To access each level of the semiconductor material 301 in the stack, an overlying level(s) 301, 303 of the stack 305 is stepped back on at least one end from an underlying level of the semiconductor material 301. Consequently, at least one end of the stack 305 is formed into a staircase structure 315.

The smaller area shown encircled in FIG. 3A illustrates a portion 319 of the contacts 317. The portion 319 is discussed in detail with reference to FIG. 3B.

FIG. 3B shows a plan view of the portion 319 of FIG. 3A. The portion 319 is shown to include two sidewall contacts 319A and a body contact 319B. The contacts 319A, 319B provide a point of electrical coupling on various portions of one end of a level of the semiconductor material 301. Consequently, strings of memory cells can be fabricated on both sides of each of the stacks 305 (e.g., so there are two memory strings per each level of the semiconductor material 301 per stack 305, one per level of the semiconductor material 301 on either side of the stack 305). Consequently, with three of the stacks 305 as shown in FIG. 3A, each with two sidewalls and each with four levels of the semiconductor material 301, 24 separate strings of memory cells can be formed. Different numbers of strings may be formed in other embodiments.

With continuing reference to FIG. 3B, in a specific embodiment, for example, in an NMOS device, an N+ region is diffused along the sidewall 331 along which various ones of the memory cells of a particular string can later be fabricated (discussed in more detail, below). In one example, the N+ region may be formed by implantation. Each of the two sidewall contacts 319A contacts a respective N+ region of the illustrated level of the semiconductor material 301. In an NMOS device, the body contact 319B provides an electrical contact to a common body 335 of the illustrated level of the semiconductor material 301—in this case, a P body. A person of ordinary skill in the art will readily recognize that a PMOS device can be constructed in a similar fashion with a N-type body and P-type sidewalls.

Referring now to FIG. 3C, a plan view schematic 350 of the apparatus 300 of FIG. 3A is shown. Each of the elements with the same numbers refers to the same elements as shown in FIG. 3A.

The plan view schematic 350 is further shown to include a number of source contacts 351, a number of data lines 353, and a number of body contact lines 355 (although only one body contact is shown for clarity, additional body contacts may be formed to each of the levels of the semiconductor material 301). Each of the source contacts 351 electrically couples a number of the strings to a source line 306. Each of the data lines 353 (e.g., bit lines) is electrically coupled to a respective one of the strings at each of a number of the levels of stack 305 by a respective one of the two sidewall contacts 319A, as described in more detail, below. Each of the body contact lines 355 is electrically coupled to the body contacts 319B of a respective one of the stacks 305 or, alternatively, to individual ones of the semiconductor materials 301 as discussed above.

Figure 3D:
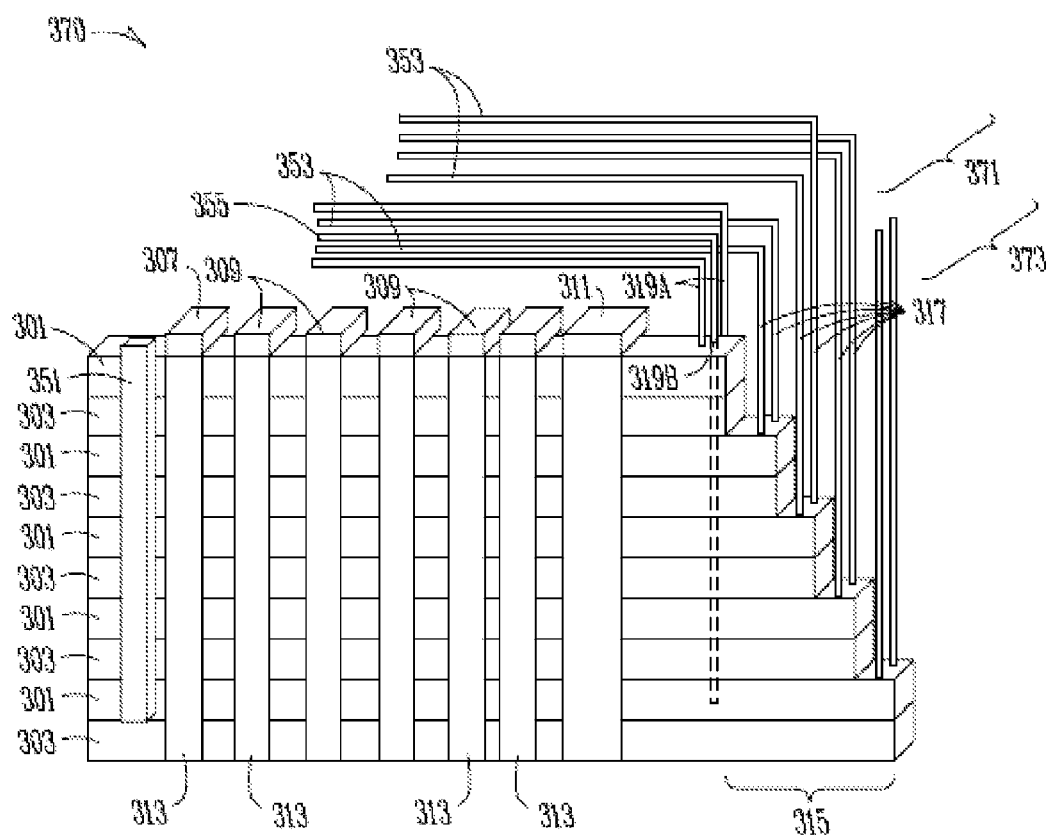

As noted above with reference to FIGS. 3A and 3B, a respective string of memory cells is fabricated along each sidewall 331 at each level of each of the stacks 305. Therefore, there are two strings per level of the semiconductor material 301 per stack 305. Each of the two strings formed along a given level of the semiconductor material 301 of one of the stacks 305 shares a common body 335 (FIG. 3B). As further illustrated in FIG. 3C, two sectional indicators (Section X-X and section Y-Y) provide reference locations for the respective cross-sectional elevational views, discussed by way of example, with reference to FIGS. 3D and 3E, below.

FIG. 3D shows a cross-sectional view 370 of Section X-X of the three-dimensional representation of an apparatus 300 of FIG. 3A. The cross-sectional view 370 shows a number of the contacts 317 (including the two sidewall contacts 319A and the body contact 319B) electrically coupled to the data lines 353 of a first metal level 373 and a number of the contacts 317 electrically coupled to data lines 353 of a second metal level 371 (albeit not all the connections are shown so as not to obscure the drawing; the remaining connections are understandable by a person of ordinary skill in the art). The body contact 319B may be punched through each level of the semiconductor material 301 in the stack 305 as indicated by the dashed line in FIG. 3D. Alternatively, a separate body contact 319B may be individually coupled to each of the semiconductor materials 301. Also, the body contact lines 355 may be constructed similarly as the body contact 319B. Individual conductive lines within the first metal level 373 and the second metal level 371 correspond to the data lines 353 discussed with reference to FIG. 3C, above. A person of ordinary skill in the art will further understand that additional metal levels may be employed. Further, the cross-sectional view 370 indicates how each of the levels of the semiconductor material 301 can be electrically accessed by the contacts due to the staircase structure 315 discussed earlier with reference to FIG. 3A. For clarity in understanding, in a specific embodiment of NMOS devices, a current (not shown) flows along each of the strings, during operation and activation of the string, from the select gate source line 307 to the select gate drain line 311.

Figure 3E:
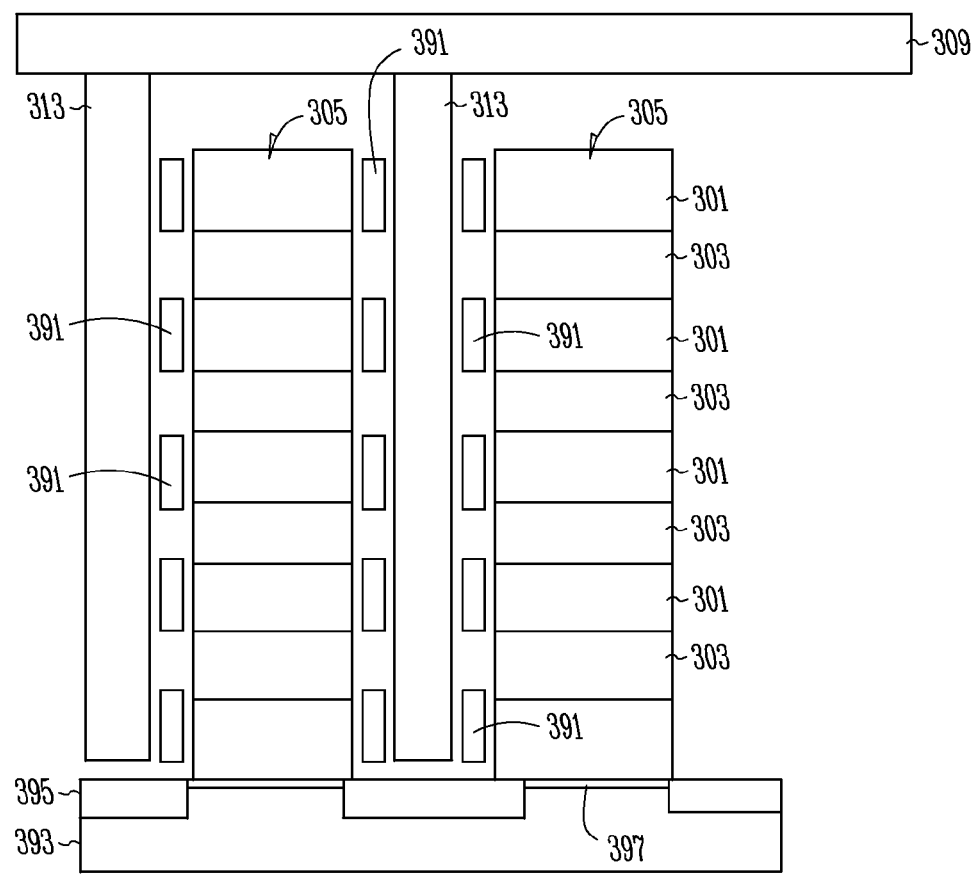

FIG. 3E shows a cross-sectional view 390 of Section Y-Y of the three-dimensional representation of the apparatus 300 of FIG. 3A. The cross-sectional view 390 indicates a number of charge storage structures 391 (e.g., floating gates or charge traps) disposed between each control gate 313 and each level of the semiconductor material 301 in the stacks 305. Accordingly, a control gate 313 is separated from a level of the semiconductor material 301 by at least a charge storage structure 391. As illustrated in the specific embodiment of FIG. 3E, each of the charge storage structures 391 form a memory cell element for a total of 15 memory cell elements. As noted above, a different string of memory cells is running along each sidewall at each level of the semiconductor material 301 of each stack 305. Consequently, each of the 15 memory cell elements shown in FIG. 3E comprises one respective cell within a respective one of 15 different strings. A first dielectric material 395 electrically isolates each control gate 313 from an underlying portion of substrate 393. A second dielectric material 397 electrically isolates each of the stacks 305 from an underlying portion of substrate 393. As discussed below, by way of example with reference to FIGS. 5A through 5K, the first dielectric material 395 and the second dielectric material 397 may be the same material. In other embodiments, the first dielectric material 395 and the second dielectric material 397 may comprise different materials. Further, FIGS. 5A through 5K provide additional details on the overall structure of the cross-sectional view 390 of Section Y-Y.

In a specific embodiment, a lateral dimension (e.g., width) of the stacks 305 may be about 300 nm. A distance between adjacent ones of the stacks 305 may be about 100 nm. Therefore, a ratio of the width of the stacks 305 to the distance between the stacks is about 3 to 1. A dimension of each level of the semiconductor material 301 and each level of the dielectric material 303 may be from about 25 nm to about 40 nm in thickness. Thus, the ratio of width to thickness of the levels of the semiconductor material 301 and levels of the dielectric material 303 may each be from about less than 8 to 1 to about 12 to 1. However, depending upon a selection of final materials used in the various portions, the single select gate architecture and a contemporaneous state of the art, the dimensions shown may be considerably different than those numbers shown above.

Figure 4A:
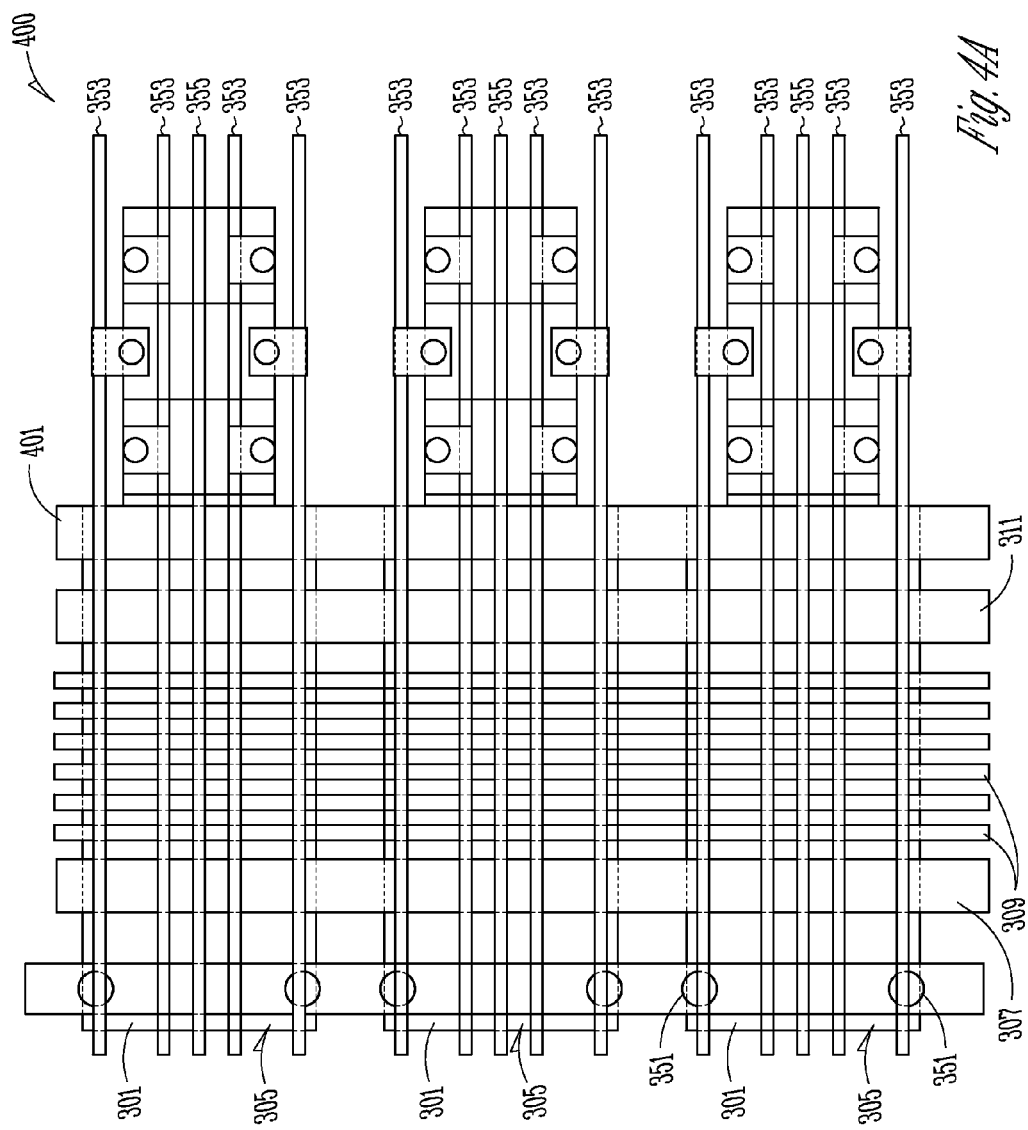

Referring now to FIG. 4A, a plan view schematic 400 shows an apparatus having a dual select gate drain architecture. The plan view schematic of FIG. 4A is similar to the plan view schematic 350 of FIG. 3C. However, FIG. 4A is shown to include the second select gate drain line 401. Therefore, the plan view schematic 400 may utilize two select gate drain transistors instead of a single select gate drain transistor as used by the device of FIGS. 3A through 3E. By adding an additional select gate drain transistor, the number of metal levels may be reduced to about one-half the number of levels used in the single select gate drain option, discussed above. Also, the number of contacts can be reduced by about one-half. Further, the length of each memory string may be reduced by about one-half. These reductions occur since the operation of a string is controlled by both the second select gate transistor and the data line.

For example, with the dual select gate drain architecture, an operation of one string is controlled by both one select gate drain transistors and one data line (e.g., the first data lines 106 (e.g., bit lines) of FIG. 1). In contrast, for the single select gate drain approach of FIGS. 3A through 3E, a voltage is applied and passed through the single select gate drain during programming for an entire block of memory cells. A string of memory cells not receiving programming is inhibited by elevating a voltage on the appropriate data line to an inhibit voltage.

The dual select gate drain architecture functions similarly to the single select gate drain architecture. However, the dual select gate drain architecture can also inhibit a string of memory cells by turning off the appropriate select gate drain transistor that controls the string without necessarily applying an inhibit voltage to the data line corresponding to that string. This dual select gate drain approach is described in more detail, by way of example, with reference to FIGS. 4B and 4C, below. As discussed in further detail below, with the dual select gate drain architecture, the operation of one string is controlled by both a select gate and bitcon. For the single drain select gate approach, a select gate voltage is turn on during programming for an entire block, the string that is not to be programmed is inhibited by elevating a data line voltage. The dual drain select gate approach can use the single select gate inhibit scheme as well, however it also can inhibit one or more strings by turning off the select gate to shut off the string even the data line voltage is low. With this approach, two strings on the same semiconductor level can share the same bitcon and same data line. Thus, the number of contact and the number of dataline can be cut to one-half the single drain select gate approach. Two strings on the same level can be electrical separated by the two drain select gates. For example, the second select gate drain line 401 can control left string, while the select gate drain line 311 can control the right string. This concept can be extended to multiple drain select gates. For example, for a given number, n, of drain select gates, the number of data line and contacts can be reduced by n times.

Figure 4B:
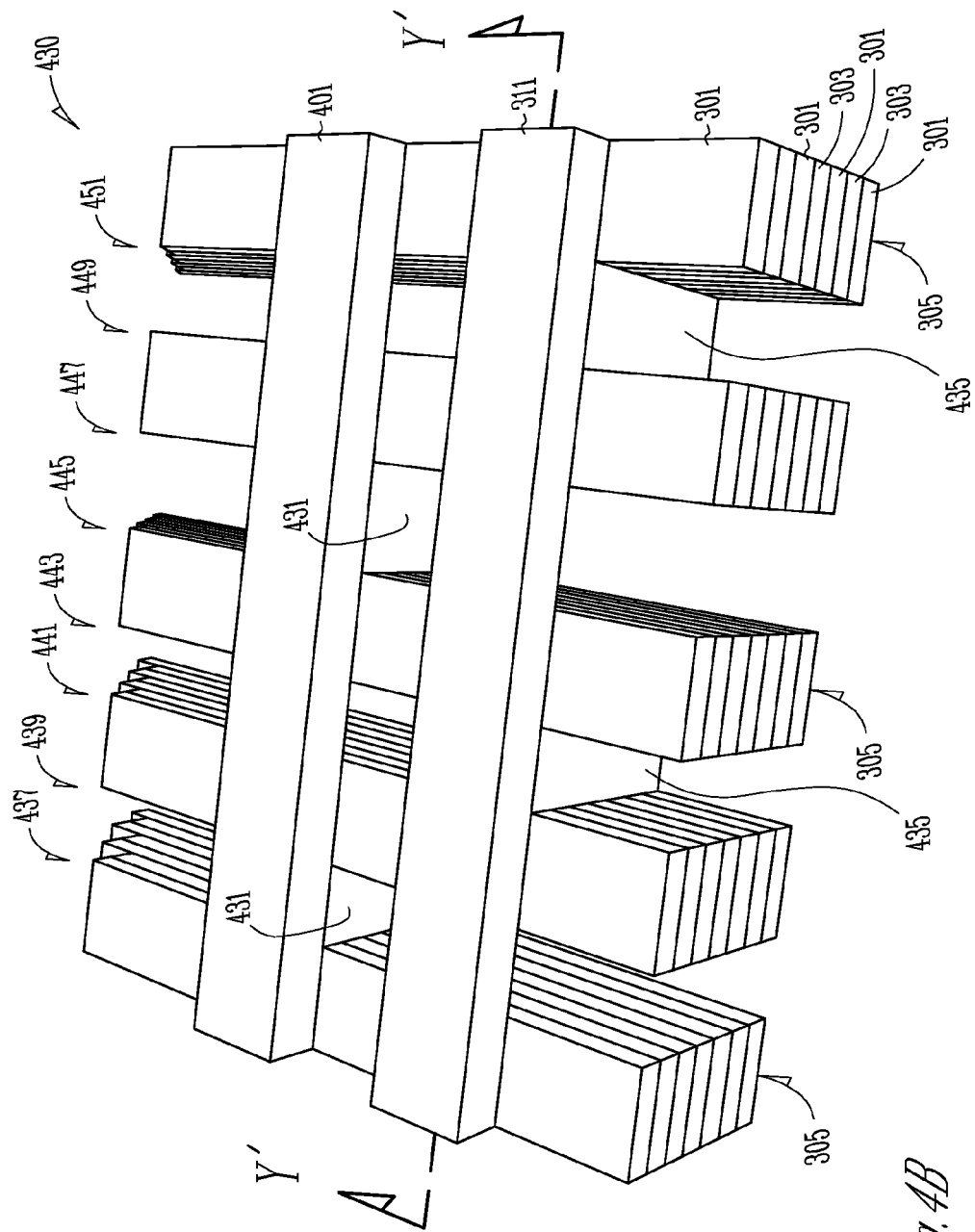

With reference to FIG. 4B, a schematic three-dimensional representation of a portion of an apparatus having a dual select gate drain architecture 430 is shown to include five of the stacks 305 comprised of alternating levels of the semiconductor material 301 and the dielectric material 303. Also as shown, the dual select gate drain architecture 430 is shown to include a first one of the select gate drain line 311 and a second select gate drain line 401. In the example of FIG. 4B, the first select gate drain line 311 is electrically coupled to a first set of control gates 435. The second select gate drain line 401 is electrically coupled to a second set of control gates 431. FIG. 4B also indicates a Y'-Y' cross-section. The Y'-Y' cross-section is discussed below with reference to FIG. 4C.

With continued reference to FIG. 4B, the leftmost of the second set of control gates 431 is located between a right sidewall 437 and a left sidewall 439 of the first two (left-most) of adjacent ones of the stacks 305, respectively. Thus, the second select gate drain line 401 is electrically coupled to the second set of the control gates 431, with a respective one of the second set of control gates 431 in every other trench. The second set of control gates 431 and levels of the semiconductor material 301 in each of the four left-most ones of the stacks 305 form second select gate drain transistors, each of which controlling current flow through a respective string of memory cells formed along one respective sidewall 437, 439, 445, 447 of each of the four left-most ones of the stacks 305. Similarly, the first set of control gates 435 and levels of the semiconductor material 301 in each of the four right-most ones of the stacks 305 form first select gate drain transistors, each of which controlling current flow through a respective string of memory cells formed along one respective sidewall 441, 443, 449, 451 of each of the four right-most ones of the stacks 305. As shown in the example of FIG. 4B, each of the stacks 305 has four levels of the semiconductor material 301. Consequently, a total of 24 select gate transistors are formed between the total of five of the stacks 305 and first and second set of control gates 431, 435 shown in FIG. 4B. In various embodiments, other numbers of select gate transistors can be formed.

Each of the select gate drain transistors can control the current flowing through a respective sidewall of a respective one of the levels of the semiconductor material 301 and, as a result, the current flowing through a string of memory cells built along that sidewall of a respective one of the stacks 305. A more detailed description and process of fabricating the memory cells is given, by way of example, with reference to FIGS. 5A through 5K, below.

FIG. 4C shows a cross-sectional view 450 of Section Y'-Y' of the three-dimensional representation of the dual select gate drain architecture 430 of FIG. 4B. Although the cross-sectional view 450 is similar to the cross-sectional view 390 of FIG. 3E, the charge storage structures 391 disposed between the levels of the semiconductor material 301 in the stacks 305 and the control gates 431 (of FIG. 4B) are not shown so as to more clearly illustrate the alternating nature of the control gates 435. Based on at least FIG. 3E, FIG. 4C, and reading the disclosure provided herein, a person of ordinary skill in the art will readily understand how to fabricate and operate the various select gate transistors and strings of memory cells described. As noted above, a respective string of memory cells may be formed along a sidewall of each level of the semiconductor material 301 in each stack 305.

FIGS. 5A through 5K show various portions of a fabrication process to form strings of memory cells, according to an embodiment. As discussed above, the techniques and fabrication processes described herein can be extended to a number of different apparatuses to be fabricated using a three-dimensional process. However, fabrication of strings of memory cells will be described below to retain clarity and consistency in the discussions that follow.

Figure 5A:
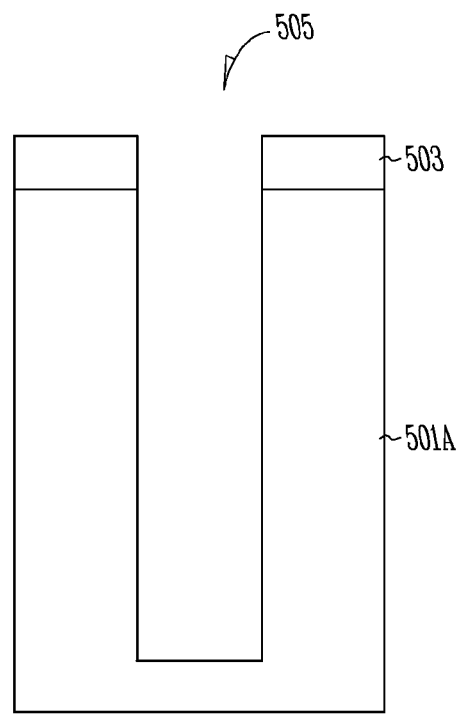
FIGS. 5A through 5K show various portions of a fabrication process to form strings of memory cells, according to an embodiment.

In FIG. 5A, a substrate 501A has been etched or otherwise partially opened to form an opening 505 therein. The substrate 501A can include, for example, any of various types of substrates used in the semiconductor and allied industries (which are referred to herein as "semiconductor substrates"). Substrate types may therefore include silicon wafers, compound wafers, thin film head assemblies, polyethylene-terephthalate (PET) films deposited or otherwise formed with a semiconducting layer, or numerous other types of substrates known independently in the art. Also, the substrate may comprise a region of a semiconductor material formed over a non-semiconductor material, or vice-versa. For ease of understanding the fabrication activities that follow, the substrate 501A may be considered to be a silicon wafer. Upon reading and understanding the disclosure provided herein, a person of ordinary skill in the art will understand how to modify the fabrication activities to account for other types of materials and electronic devices.

In one embodiment, the opening 505 is a trench. In other embodiments, the opening can be comprised of geometries other than a trench. However, for ease in understanding fabrication of the inventive subject matter discussed herein, the opening 505 can be considered to be a trench. In a specific example, the opening 505 is 1000 Å wide and may be formed to any depth as discussed, by way of example, below. In a specific embodiment, the opening 505 can be formed by an anisotropic dry etch process (e.g., reactive ion etch (RIE) or plasma etch). In other embodiments, the opening 505 may be formed by various types of chemical anisotropic etchants (e.g., such as potassium hydroxide (KOH) or tetramethyl ammonium hydroxide (TMAH)), mechanical techniques, other types of ion milling, or laser ablation techniques. In the case of a chemical etchant, various lattice planes in, for example, single crystal materials can assist in vertical sidewall formation. However, in other embodiments, vertical sidewall formation is not necessary and a sidewall slope to the opening 505 may be considered in certain applications. Related industries such as micro-electrical mechanical systems (MEMS) may independently supply techniques for still further means to form the opening 505.

A hard mask 503 is formed over the substrate 501A. The hard mask 503 may comprise, for example, a photoresist layer or other type of applied material that is resistant to various ones of the chemical process activities discussed, by way of example, below. Further, although the process actions may refer to particular dielectric materials, such as silicon dioxide, silicon nitride, or others, a person of ordinary skill in the art and familiar with this disclosure will recognize that other dielectric materials may be substituted and still be within a scope of the inventive subject matter. Thus, the material choices and selections presented are merely provided as an aid in understanding one example of a fabrication process.

Figure 5B:
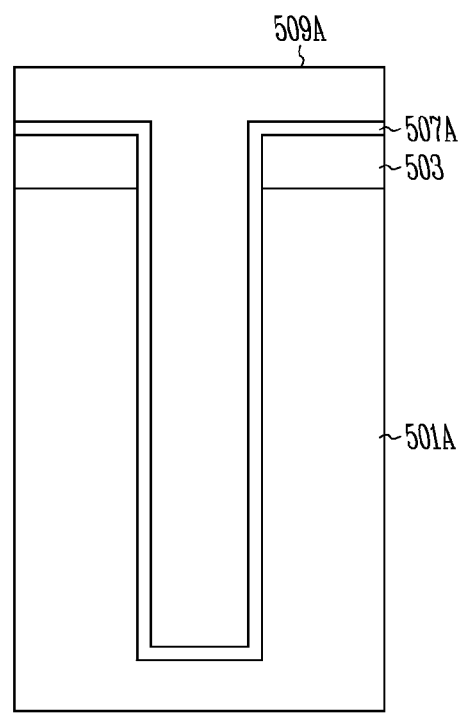

In FIG. 5B, a silicon dioxide liner 507A may be formed over the substrate 501A (including on the sidewalls and bottom of the opening 505) and the hard mask 503. A silicon nitride fill 509A is then applied, deposited, or otherwise formed over the silicon dioxide liner 507A. Although the example in FIG. 5B shows the silicon nitride fill 509A completely covering the silicon dioxide liner 507A, it is sufficient to only partially fill a lower-most portion of a cavity (e.g., to cover the closed end of the cavity) formed within the silicon dioxide liner 507A.

Figure 5C:
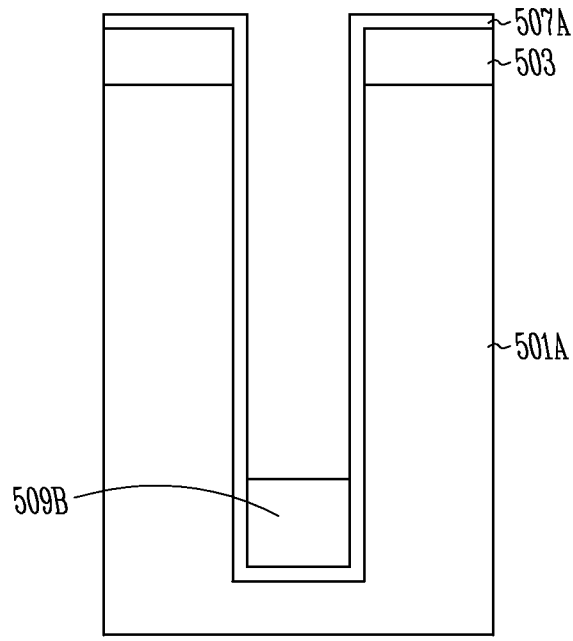

In FIG. 5C, the silicon nitride fill 509A is etched back or otherwise partially removed to form a first (silicon nitride) block 509B. In a specific example, the first block 509B may be from about 200 Å to about 300 Å (e.g., 20 nm to 30 nm) in thickness.

Figure 5D:
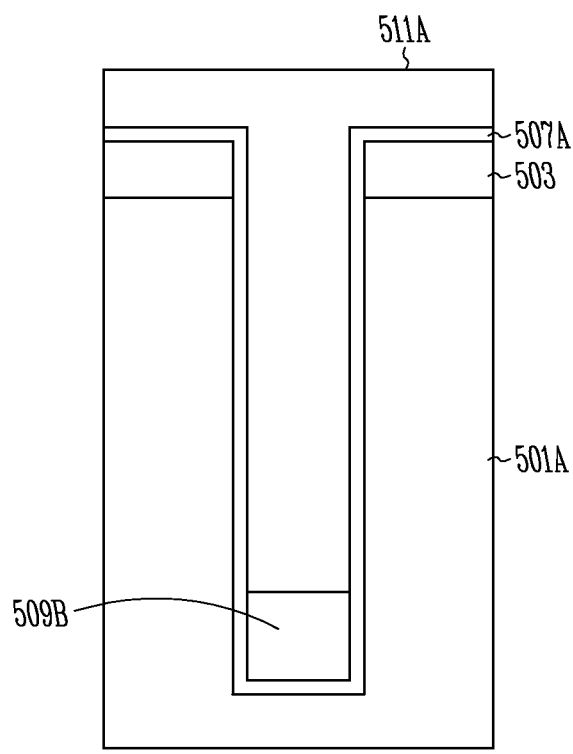

In FIG. 5D, a silicon dioxide fill 511A is then applied, deposited, or otherwise formed over the first block 509B. As with the silicon nitride fill 509A discussed above, the silicon dioxide fill 511A may only partially fill the cavity remaining over the first block 509B.

Figure 5E:
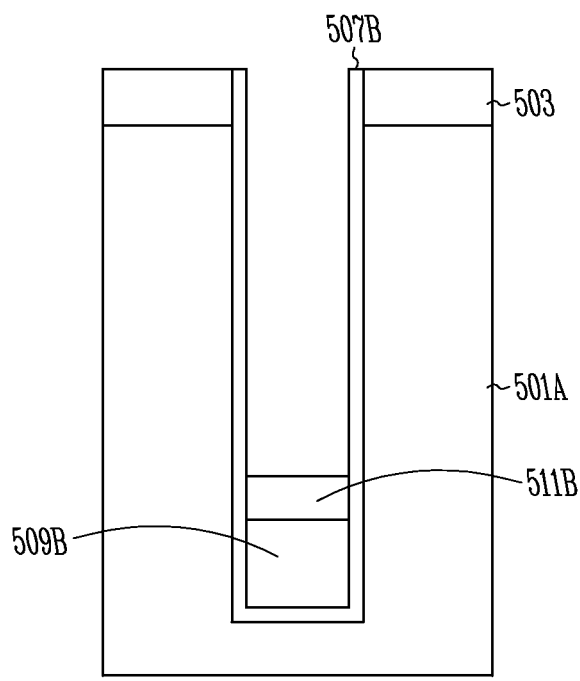

FIG. 5E shows the silicon dioxide fill 511A after being etched back or otherwise partially removed to form a second (silicon dioxide) block 511B. In a specific example, the second block 511B may be from about 100 Å to about 400 Å (e.g., 10 nm to 40 nm) in thickness. In other examples, the second block may be from about 100 Å to about 200 Å (e.g., 10 nm to 20 nm) in thickness. Portions of the silicon dioxide liner 507A may also be removed during the partial removal of the silicon dioxide fill 511A leaving a reduced silicon dioxide liner 507B. The dimensions shown are merely provided as an aid in understanding and may vary considerably depending on, for example, different apparatuses or design rules.

Figure 5F:
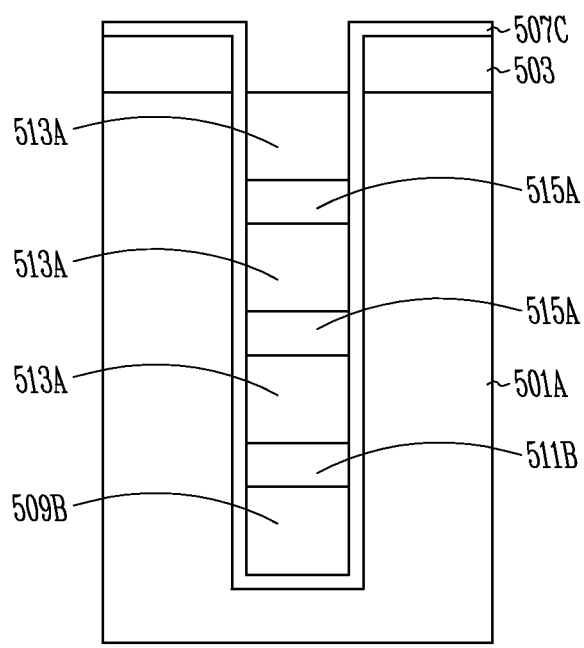

With reference now to FIG. 5F, the process discussed by way of example above with reference to FIGS. 5B through 5F may be repeated any number of times to form an alternating arrangement of the first blocks 513A (e.g., including the first block 509B) and the second blocks 515A (including the block 511B) within opening 505. As further discussed above, each of the blocks may comprise different materials other than those shown. As readily understood by a person of ordinary skill in the art upon reading and understanding the disclosure provided herein, any number of materials may be selected for the blocks provided there is an etch or chemical consumption rate difference between adjoining blocks and the substrate 501A. For example, alternating layers of aluminum oxide ($Al_2O_3$) and hafnium oxide ($HfO_2$) can be substituted for the silicon nitride and silicon dioxide blocks. Also, various other combinations may also be substituted or included.

Further, one or more of the various blocks may include more than one material type provided etch or chemical consumption differences, discussed above, are considered. Depending upon which of the blocks is last etched or otherwise partially removed, a dielectric liner 507C may be present on the hard mask 503 as shown. The dielectric liner 507C still separates the various blocks from the substrate 501A in either case. For example, if the final material removed in the process is silicon nitride, the dielectric liner 507C may be on the hard mask 503. Alternatively, if the final material removed in the process is silicon dioxide, then the dielectric liner 507C may not be present on the hard mask 503.

Further, FIG. 5F shows a first block 509B, 513A on both the bottom and top of the alternating arrangement. However, there is no requirement for this arrangement. For example, a second block 515A, 511B may be formed on the top and bottom of the alternating arrangement. Alternatively, a second block 511B may be formed on the bottom and a first block 513A on the top of the alternating arrangement, or vice versa. The final arrangement may be based on, for example, the particular apparatus being formed.

Figure 5G:
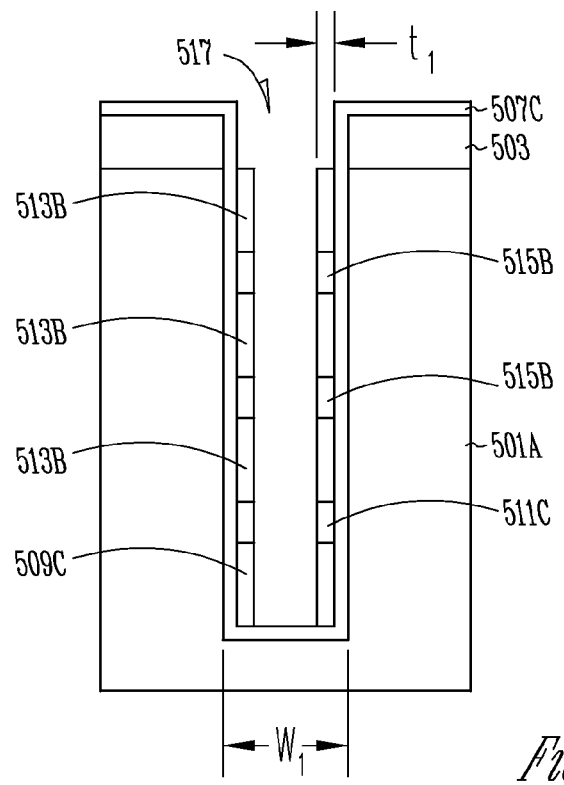

With reference now to FIG. 5G, a second opening 517 is formed within the alternating arrangement (e.g., through the various blocks previously fabricated). The second opening may be formed by, for example, a dry etch process, such as a reactive ion etch (RIE) or various types of plasma etch. Alternatively or in conjunction, mechanical milling, ion milling, laser ablation, sputter etch, or vapor phase etchants may be used to form the second opening 517. Forming the second opening forms an alternating arrangement of first sidewall (silicon nitride) blocks 513B, 509C and second sidewall (silicon dioxide) blocks 515B, 511C.

In a specific example, the second opening 517 may be formed such that a resulting width of the sidewall blocks is about 200 Å to about 300 Å. As discussed above with reference to FIG. 5A, the opening 505 was described as a trench about 1000 Å wide, $W_1$. Thus, since the width, $t_1$, of the sidewall blocks on each side of the trench is about 300 Å and the opening 505 (FIG. 5A) was about 1000 Å wide, a resultant width of the second opening can be about 400 Å wide. However, these numbers are merely provided as examples and may vary depending on a number of factors such as the apparatus being fabricated, a depth of the opening 505, and an overall density of memory cells selected for a given design.

Figure 5H:
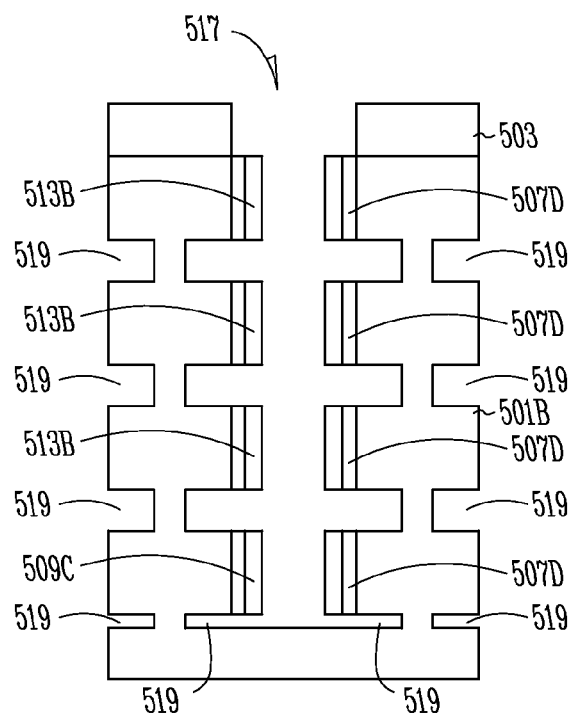

With concurrent reference to FIGS. 5G and 5H, the second sidewall blocks 515B, 511C and portions of the dielectric liner 507C underlying the second sidewall blocks are etched or otherwise removed to expose portions of the substrate 501A. After these silicon dioxide areas are removed, the first sidewall blocks 509C, 513B, and portions of the dielectric liner 507D underlying the first sidewall blocks remain within the second opening 517. A subsequent removal of at least a portion of the exposed portions of substrate 501A occurs by, for example, use of an anisotropic removal activity.

In a specific example, the anisotropic removal activity may be performed with an etchant, such as TMAH, leaving an etched substrate 501B. If the substrate 501A is selected to be silicon or another single crystal material, an orientation may be selected to open a number of lateral openings 519 that are substantially perpendicular (i.e., about a 90° lateral etch) to the second opening 517. For example, both a <100> and a <111> oriented silicon will etch with the lateral openings being substantially perpendicular to the second opening 517. The etchant may be chosen to have a high etch selectivity between the silicon nitride and the substrate and high etch selectivity between crystal orientations. Both TMAH and KOH have a high etch selectivity rate difference between silicon nitride or silicon dioxide and silicon. KOH may also be used as a chemical etchant provided that potential potassium contamination is not a concern for a particular device being fabricated.

In other specific examples, other chemicals may be used for an anisotropic silicon etch. In addition to TMAH and KOH, ethylene-diamene-pyrocatechol (EDP) may also be an effective etchant. Although primarily anisotropic etchants have been discussed, isotropic etchants may also be employed. For example, a hydrofluoric/nitric/acetic (HNA) acid chemical etchant may be used.

Figure 5I:
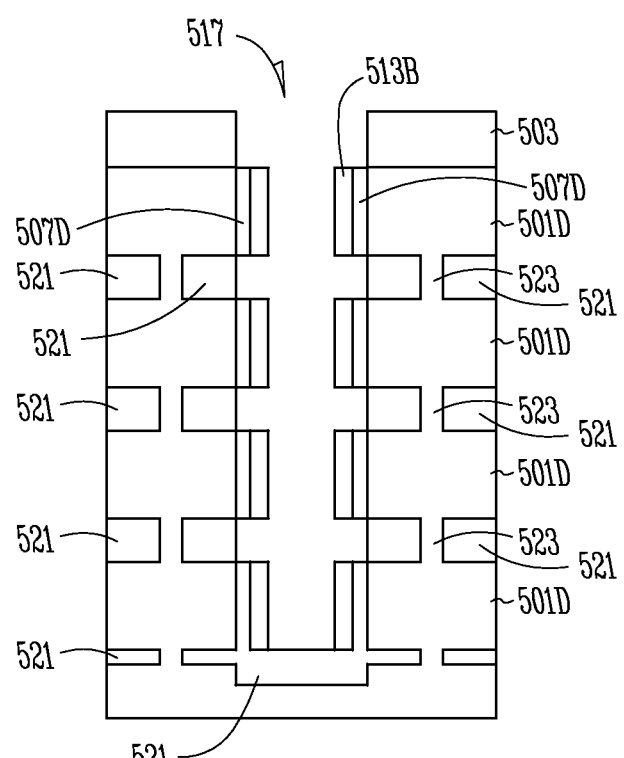

Referring now to FIG. 5I, an embodiment is shown for forming stacks of alternating levels of semiconductor material and levels of dielectric material. Since the lateral openings 519 of FIG. 5H were only partially etched through, a substrate pillar portion 523 was left between adjacent ones of the lateral openings 519. In FIG. 5I the lateral openings 519 of FIG. 5H are now filled with, for example, a thermally grown silicon dioxide, creating a number of filled areas 521. Alternatively, rather than a thermally grown oxide, the filled areas 521 can be formed by a deposition process such as chemical vapor deposition (CVD), atomic level deposition (ALD), physical vapor deposition (PVD), or other techniques known independently in the art. The filled areas 521 formed in the lateral openings 519 between portions of the substrate 501D. Depending upon the thickness of the substrate pillar portion 523, the thermal oxidation process used to form the filled areas 525 in the example just described may completely consume the substrate pillar portion 523 as discussed, by way of example, with reference to FIG. 5J-2, below. However, the device will still function with the substrate pillar portion 523 remaining.

Figures 1, 5J:
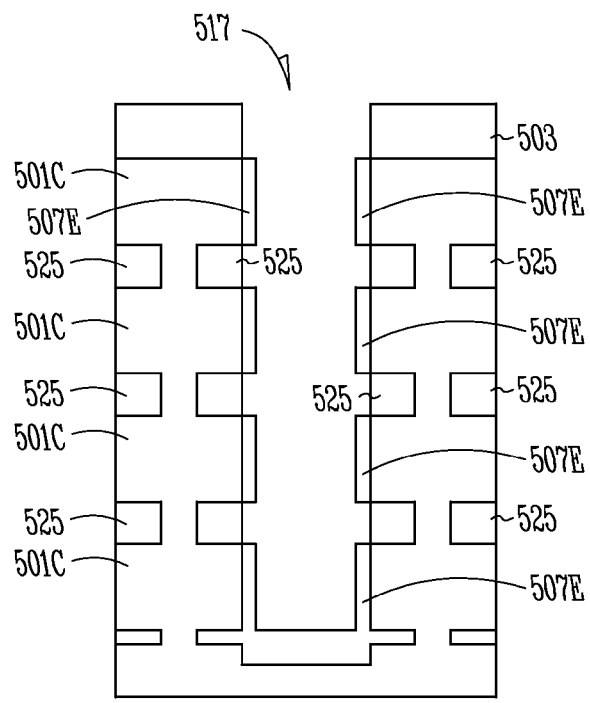
Figures 2, 5J:
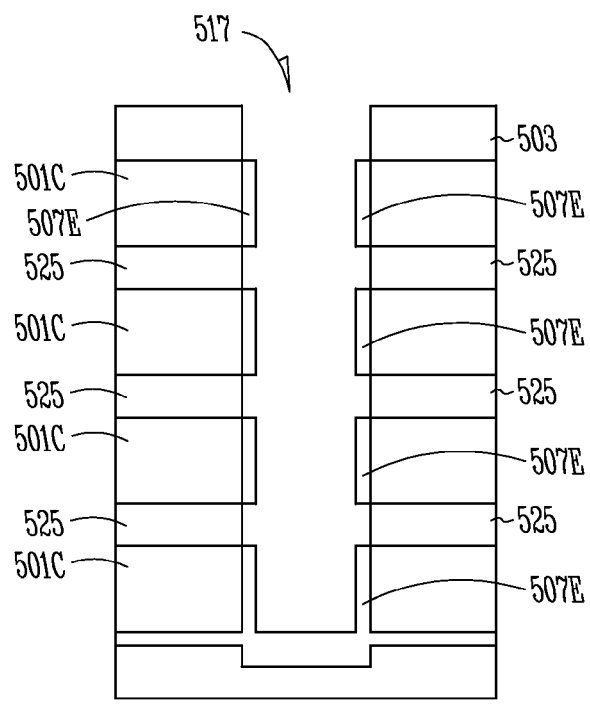

In FIG. 5J-1, the first sidewall blocks 509C, 513B have been removed. The first sidewall blocks 509C, 513B may be removed by various etchants or other means as discussed herein. Also, the remaining portions of the dielectric liner 507D may optionally be removed and replaced by a higher quality dielectric 507E, such as a tunnel oxide material. The tunnel oxide material may be, for example, a thermally grown silicon dioxide material. As can further be seen from FIG. 5J-1, at least one material in the stack of alternating materials is substantially coplanar with a bottom portion of the number of trenches (see also FIGS. 3E and 4C).

FIG. 5J-2 is similar to the structure of FIG. 5J-1. However, each of the substrate pillar portions 523 has been consumed by the thermal oxidation process as discussed above with reference to FIG. 5I.

Figure 5K:
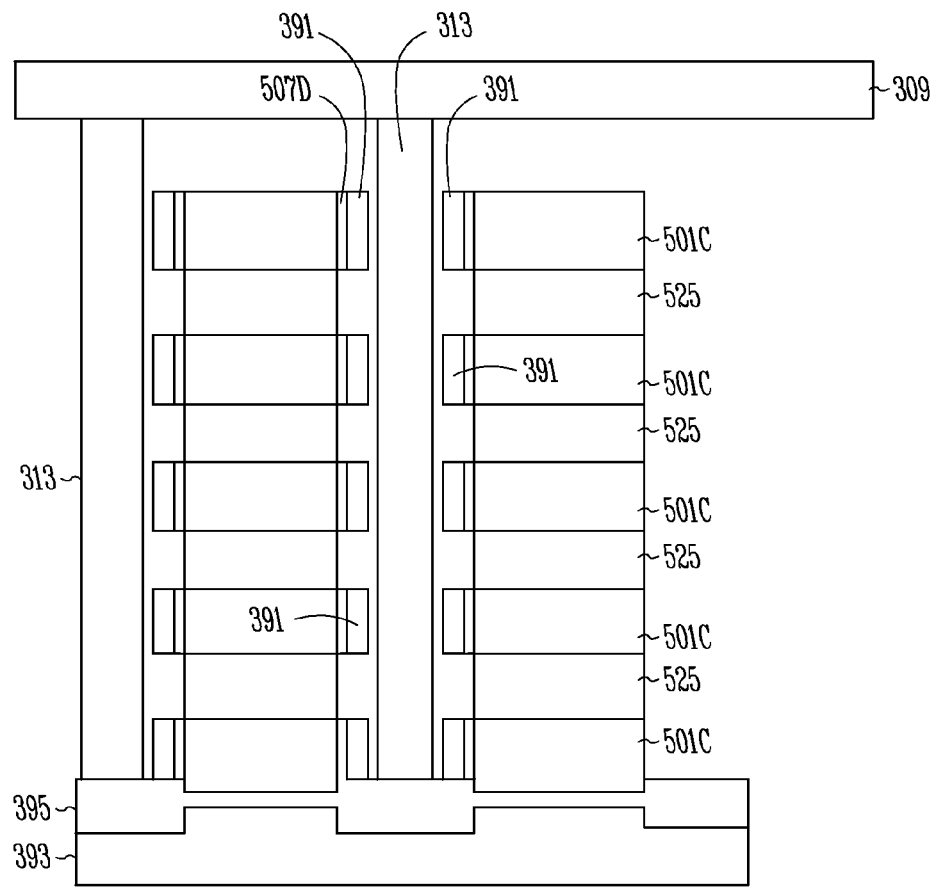

FIG. 5K shows an elevational view of a completed portion of a stack of alternating levels of semiconductor material and dielectric material. The elevational view of FIG. 5K may be similar to the cross-sectional view 390 of Section Y-Y of FIG. 3E. The elevational view shows a number of the charge storage structures 391 that have been added and disposed between each level of the semiconductor material 301 and each control gate 313 in the stack 305. Each of the charge storage structures 391 forms a memory cell element for a total of the 15 memory cell elements as viewable from FIG. 5K. As noted above, a respective string of memory cells is disposed along a sidewall at each level of the semiconductor material 301 of the stack 305. Consequently, each of the 15 memory cell elements shown in FIG. 5K comprises one respective cell within a respective string. The control gates 313, the charge storage structures 391, and the access line 309 may be formed from, for example, polysilicon or some other conductor, using techniques such as those already known in the art.

The fabrication techniques and apparatuses resulting therefrom described, by way of example above, may use single crystal silicon as a string channel (e.g., see FIG. 3B). However, the three-dimensional stacks (e.g., the stacks 305 of FIG. 3A et seq.) can advantageously be used to increase cell density while maintaining a relatively small footprint. Further, the fabrication techniques and architectures resulting therefrom can be extended to NOR devices, microcontroller devices, other memory types, general purpose logic, or a host of other apparatuses. Various three-dimensional devices, repeating devices (e.g., SRAM), transistors, standard CMOS logic, and so on may all benefit from application of the three-dimensional processes disclosed herein.

Figure 6:
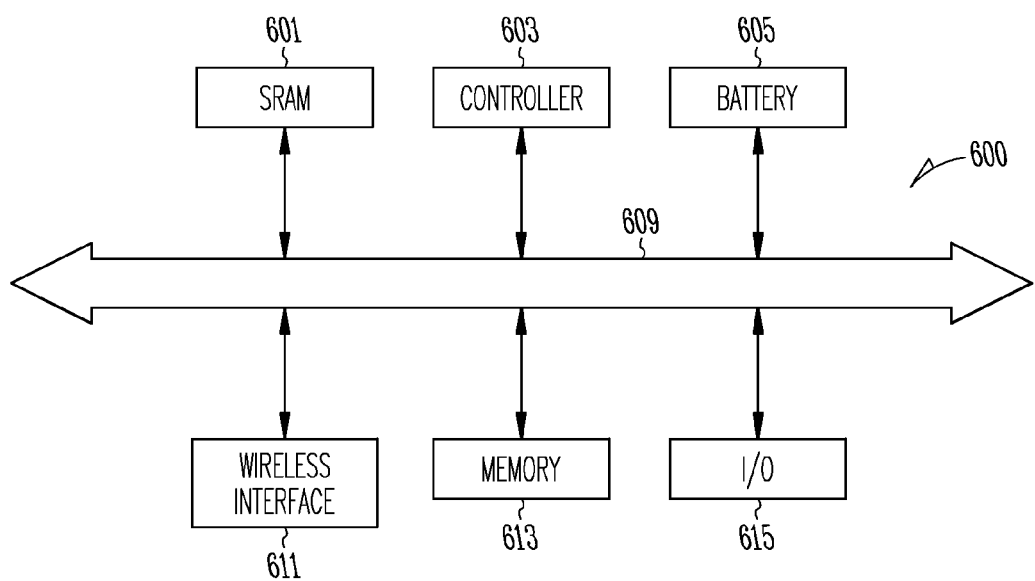
FIG. 6 shows a block diagram of a system embodiment, including a memory device.

With reference now to FIG. 6, a block diagram of an illustrative embodiment of an apparatus in the form of a system 600 including one or more memory devices (e.g., the memory device 101 of FIG. 1) is shown. The system 600 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 600 may be used in any of the following systems: a wireless local area network (WLAN) system, a wireless personal area network (WPAN) system, or a cellular network.

The system 600 of FIG. 6 is shown to include a controller 603, an input/output (I/O) device 615 (e.g., a keypad or a display), the memory device 101 of FIG. 1, a wireless interface 611, and a static random access memory (SRAM) device 601 electrically coupled to each other via a bus 609. A battery 605 may supply power to the system 600 in one embodiment. The memory device may include a NAND memory, a flash memory, a NOR memory, a combination of these, or the like.

The controller 603 may include, for example, one or more microprocessors, digital signal processors, micro-controllers, or the like. The memory device 101 may be used to store messages transmitted to or by the system 600. The memory device 101 may optionally also be used to store instructions that are executed by the controller 603 during operation of the system 600 and may be used to store user data either generated, collected, or received by the system 600 (such as image data). The instructions may be stored as digital information and the user data, as disclosed herein, may be stored in one section of the memory as digital data and in another section as analog memory. As another example, a given section at one time may be labeled to store digital information and then later may be relabeled and reconfigured to store analog information.

The I/O device 615 may be used to generate a message. The system 600 may use the wireless interface 611 to transmit and receive messages to and from a wireless communication network with a radio frequency (RF) signal. Examples of the wireless interface 611 may include an antenna, or a wireless transceiver, such as a dipole antenna. However, the scope of the inventive subject matter is not limited in this respect. Also, the I/O device 615 may deliver a voltage reflecting what is stored as either a digital signal (if digital information was stored), or as an analog signal (if analog information was stored). While an example in a wireless application is provided above, embodiments of the inventive subject matter disclosed herein may also be used in non-wireless applications as well.

The various illustrations of apparatus (e.g., the memory device 101 and examples of the various fabrication stages illustrated with reference FIGS. 5 through 5K) are intended to provide a general understanding of the structure of various embodiments and are not intended to provide a complete description of all the elements and features of the apparatus that might make use of the structures, features, and materials described herein.

The apparatus of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

One skilled in the art will appreciate that, for this and other methods disclosed herein, the methods may be implemented in a differing order. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. For example, instead of floating gate flash memory devices, charge trap memory devices may be used. Many modifications and variations can be made, as will be apparent to a person of ordinary skill in the art upon reading and understanding the disclosure. Functionally equivalent methods and devices within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to comply with 37 C.F.R. §1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
   forming a first opening in a semiconductor substrate;
   forming an alternating arrangement of first and second blocks within the first opening, the first block comprising a different material than the second block;
   forming a second opening within the alternating arrangement to form an alternating arrangement of first and second sidewall blocks from the first and second blocks, respectively;
   removing at least the second sidewall blocks to expose portions of the substrate; and
   forming lateral openings in the substrate at the exposed portions.

2. The method of claim 1, further comprising:
   prior to forming the alternating arrangement of first and second blocks within the first opening, forming a dielectric liner on at least sidewalls of the first opening, wherein removing at least the second sidewall blocks to expose portions of the substrate further comprises removing portions of the dielectric liner underlying the second sidewall blocks;
   forming a control gate in the second opening; and
   forming a number of charge storage structures disposed between the control gate and remaining portions of the substrate.

3. The method of claim 1, wherein forming a first opening in a semiconductor substrate comprises forming a trench in a silicon substrate.

4. The method of claim 3, wherein a respective silicon pillar is left between each of the lateral openings and a respective corresponding lateral opening is formed from another opening in the substrate.

5. The method of claim 3, further comprising forming a dielectric material within the lateral openings in the silicon substrate.

6. A method of fabricating an electronic device, the method comprising:
   forming a plurality of trenches in a base substrate;
   forming alternating layers of semiconductor material and dielectric material disposed within each of the plurality of trenches;
   forming an opening at least substantially through the alternating layers of semiconductor material and dielectric material thereby forming sidewalls on the alternating layers of semiconductor material and dielectric material;
   forming a control gate within the opening and proximate to a portion of the sidewalls of the alternating layers of semiconductor material and dielectric material; and
   forming a charge storage structure disposed between the control gate and sidewalls of the layers of semiconductor material.

7. The method of claim 6, wherein the alternating layers of semiconductor material and dielectric material are formed from alternating silicon and silicon dioxide layers.

8. The method of claim 6, wherein the charge storage structure is a floating gate formed on opposing sides of the control gate proximate to the sidewalls of the layers of semiconductor material.

9. The method of claim 6, further comprising:
   forming a first of the alternating layers of semiconductor material and dielectric material substantially coplanar with a bottom portion of the plurality of trenches; and
   forming each of the remaining ones of the alternating layers of semiconductor material and dielectric material over a preceding one of the alternating layers of semiconductor material and dielectric material.

10. The method of claim 6, further comprising:
    removing the dielectric material to expose portions of the base substrate; and
    forming lateral openings in the base substrate at the exposed portions.

11. The method of claim 10, further comprising forming a dielectric material within the lateral openings in the base substrate.

12. The method of claim 11, wherein the base substrate comprises a silicon substrate, the dielectric material comprises thermally-grown silicon dioxide.

13. The method of claim 12, wherein the thermally-grown silicon dioxide formed within the lateral openings in the silicon substrate substantially consume a respective silicon pillar left between each of the lateral openings and a respective corresponding lateral opening formed in an adjacent one of the plurality of trenches in the substrate.

14. A method of fabricating a device, the method comprising:

forming a first trench in a silicon substrate;

forming alternating layers within the trench, the alternating layers consisting of a first material and a second material that is dissimilar to the first material;

forming a second trench within the alternating layers, the second trench being substantially parallel with the first trench and formed substantially entirely within the first trench;

removing the second material; and laterally forming openings in the silicon substrate, the openings being proximate to a prior location of the removed second material.

15. The method of claim 10, further comprising:

prior to forming the alternating layers within the first trench, forming a liner dielectric on sidewalls of the first trench;

forming a control gate proximate to a remaining portion of a sidewall of the second trench; and forming a charge storage structure disposed between the control gate and each of the remaining portions of the sidewall of the second trench.

16. The method of claim 15, further comprising reforming the liner dielectric on the sidewalls of the first trench after forming each subsequent layer of the second material.

17. A method of fabricating a device, the method comprising:

forming a plurality of first trenches in a silicon substrate;

forming pairs of a first dielectric material and a second dielectric material within each of the plurality of trenches, the second material being dissimilar to the first dielectric material, the pairs forming a multiple level structure;

forming a second trench substantially through the multiple level structure formed in each of the plurality of first trenches in the silicon substrate;

removing the second dielectric material from the multiple level structure formed in each of the plurality of first trenches in the silicon substrate;

forming lateral openings in the silicon substrate, the lateral openings being proximate to a prior location of the removed second dielectric material; and removing the first dielectric material.

18. The method of claim 17, wherein forming the lateral openings in the silicon substrate opens a lateral via to an adjacent one of the plurality of first trenches.

19. The method of claim 17, wherein forming the lateral openings in the silicon substrate leaves a portion of silicon remaining in between a first of the plurality of first trenches and an adjacent one of the plurality of first trenches.

20. The method of claim 19, wherein the portion of silicon remaining forms a body contact.

21. The method of claim 17, further comprising:

forming a dielectric material within the lateral openings in the silicon substrate;

forming a plurality of control gates, each of the plurality of control gates being proximate to a portion of a sidewall of the plurality of second trenches; and forming a floating gate disposed between the plurality of control gates and the portion of the sidewall.

22. The method of claim 21, further comprising forming at least one select gate transistor coupled to alternating ones of the plurality of control gates.

23. The method of claim 21, further comprising forming at least one string of memory cells on the portion of the sidewall of the plurality of second trenches.

* * * * *